United States Patent
Schneider et al.

(10) Patent No.: US 7,365,577 B2
(45) Date of Patent: Apr. 29, 2008

(54) NOISE WAVEFORM GENERATOR WITH SPECTRUM CONTROL

(75) Inventors: Kenneth S. Schneider, Jericho, NY (US); Leo P. Moodenbaugh, Westhampton, NY (US); Arthur B. Williams, Smithtown, NY (US); John E. Meade, Northport, NY (US)

(73) Assignee: Telebyte, Inc., Hauppague, NY (US)

( * ) Notice: Subject to any disclaimer, the term of this patent is extended or adjusted under 35 U.S.C. 154(b) by 1400 days.

(21) Appl. No.: 10/295,304

(22) Filed: Nov. 15, 2002

(65) Prior Publication Data

US 2004/0095167 A1 May 20, 2004

(51) Int. Cl.
*H03K 3/84* (2006.01)

(52) U.S. Cl. .................. 327/100; 327/164

(58) Field of Classification Search ............ 327/100, 327/164
See application file for complete search history.

(56) References Cited

U.S. PATENT DOCUMENTS

| | | | |
|---|---|---|---|
| 5,283,784 A * | 2/1994 | Genter | 370/288 |
| 6,163,608 A * | 12/2000 | Romesburg et al. | 379/406.01 |
| 6,842,734 B2 * | 1/2005 | Yamada et al. | 704/245 |

\* cited by examiner

*Primary Examiner*—Kenneth B. Wells
(74) *Attorney, Agent, or Firm*—Kenyon & Kenyon LLP

(57) ABSTRACT

A waveform generator for generating a desired waveform is provided, including a noise kernel configured to store a plurality of samples from a predetermined waveform, the plurality of samples being assigned to a plurality of memory blocks; and an address arrangement configured to randomly select a selected one of the plurality of memory blocks; wherein the noise kernel is configured to communicate the plurality of samples assigned to the selected memory block.

12 Claims, 13 Drawing Sheets

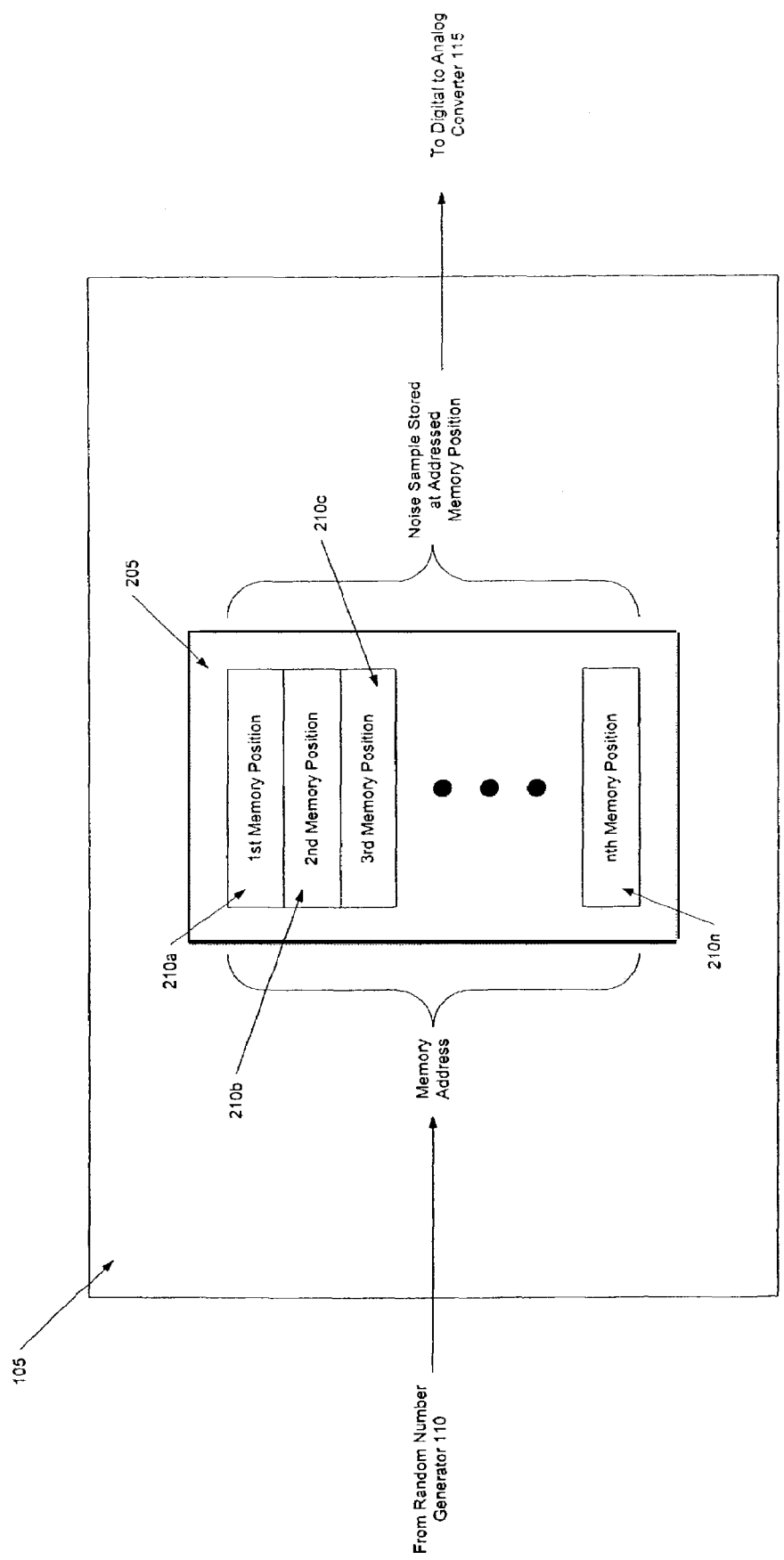

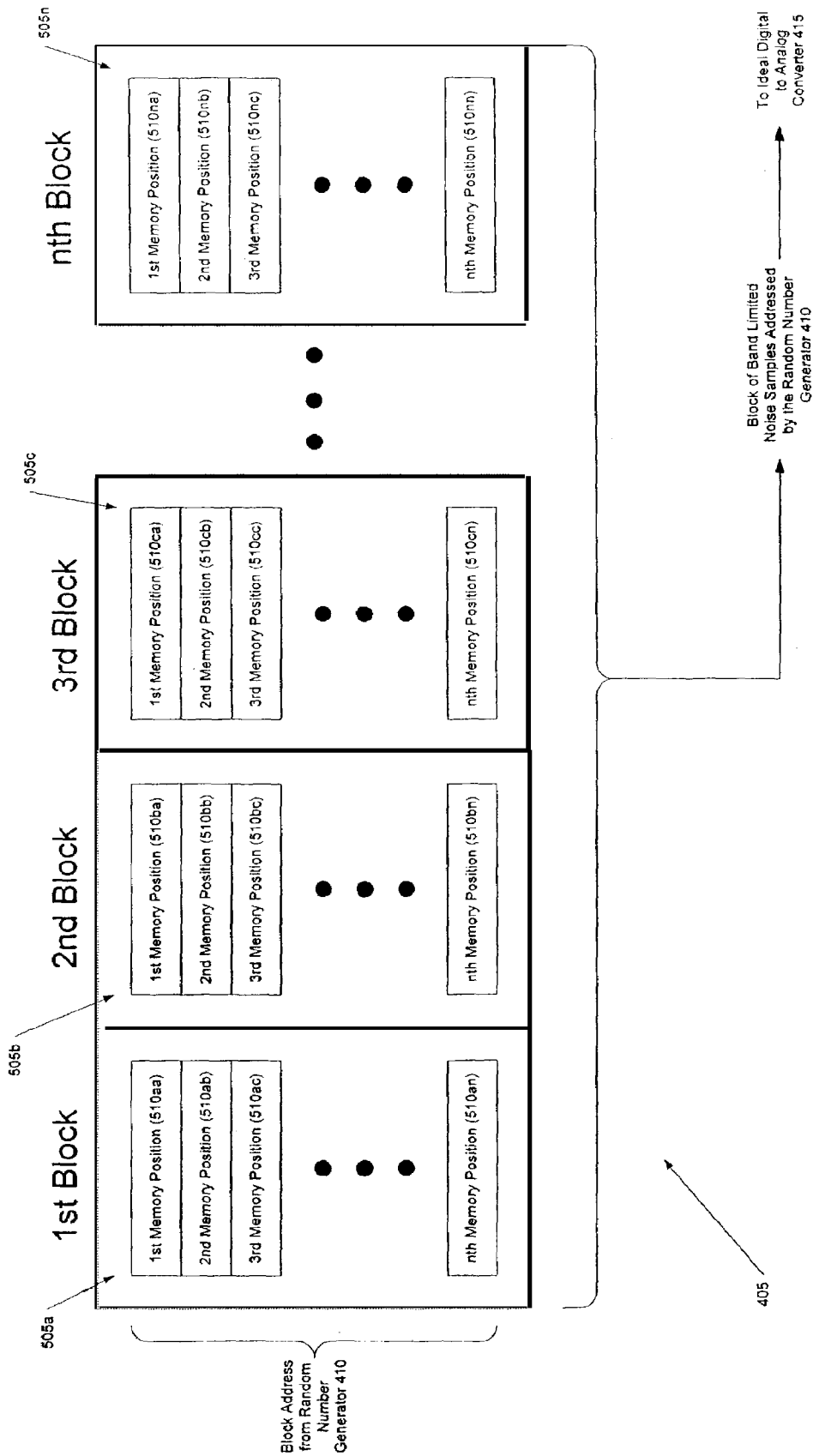

$|X_{Gaus}(f)|^2 = S_{Gaus}(f)$ $\phi_{Gaus}(\tau)$

NOISE WAVEFORM GENERATOR WITH SPECTRUM CONTROL

FIELD OF THE INVENTION

The present invention relates to a device for generating a desired waveform, for example, a band-limited noise waveform.

BACKGROUND INFORMATION

A modem and/or other signaling device, such as a Digital Subscriber Line Access Multiplexer (DSLAM), may communicate digital information (e.g., binary data bits) via a communications channel, for example, a cable. In real-world applications, noise, which may be present in the communication channel, may interfere with the digital information communicated by the modem. This interference may, for example, cause bit errors in the transmitted digital information.

At least in some applications, bit errors may be tolerated, so long as the bit error rate is kept below a predetermined threshold, for example, no more than 1 bit error for every 10,000,000 bits transmitted (i.e., a bit error rate below $1\times10^{-7}$).

To test the bit error rate of the modem, for example, noise having a known power spectral density and a known statistical distribution (e.g., Gaussian) may be intentionally injected into the communications channel, after which the bit error rate may be measured in a conventional manner using, for example, a bit error rate measurement device. For this purpose, the noise may be generated or simulated.

The bit error test may require various noise waveforms having different statistical characteristics, such as, for example, an additive white Gaussian (AWGN) noise waveform $X_{gaus}(t)$. The Fourier Transform $X_{gaus}(f)$, the Power Spectral Density $S_{gaus}(f)$, and the autocorrelation function $\phi_{Gaus}(\tau)$ of the Gaussian noise waveform $X_{Gaus}(t)$ are given by the following equations:

$$F(X_{Gaus}(t)) = X_{Gaus}(f) = \int_{-\infty}^{+\infty} X_{Gaus}(t)e^{-j2\pi ft}\,dt$$

$$S_{Gaus}(f) = |X_{Gaus}(f)|^2 = F(\varphi_{Gaus}(\tau))$$

$$\varphi_{Gaus}(\tau) = \lim_{T\to\infty} \int_{-T}^{+T} X_{Gaus}(t)X_{Gaus}(t+\tau)\,dt$$

Referring to FIGS. 7a and 7b, it may be seen that the Power Spectral Density $S_{gaus}(f)$ of the additive white Gaussian noise (AWGN) waveform $X_{gaus}(t)$ is constant throughout frequency, whereas the autocorrelation function $\phi_{Gaus}(\tau)$ of the Gaussian noise waveform $X_{Gaus}(t)$ is an impulse function centered at zero (i.e., $\delta(\tau)$).

Referring now to FIGS. 8a and 8b, there is seen the Power Spectral Density $S_{gau-BL}(f)$ and the autocorrelation function $\phi_{Gaus-BL}(\tau)$, respectively, for an exemplary low-pass filtered Gaussian noise waveform $X_{gaus-BL}(t)$ (i.e., band-limited Gaussian noise). As can be seen in FIG. 8a, the Gaussian noise waveform has been filtered to exhibit only those frequencies at or below frequency (F). In this manner, the Power Spectral Density $S_{gaus-BL}(f)$ of the band-limited Gaussian noise waveform $X_{gaus-BL}(t)$ is constant between (−F) and (F), whereas the autocorrelation function $\phi_{Gaus-BL}(\tau)$ of the band-limited Gaussian noise waveform $X_{Gaus-BL}(t)$ is a Sinc function.

The various noise waveforms may be simulated, for example, by generating noise samples of a known statistical distribution (e.g., Gaussian Noise) and power spectral density, and providing these samples to an external device, such as an Arbitrary Waveform Generator (ARB) and/or digital to analog converter (D/A), to produce a desired noise waveform.

However, it is believed that this simulation method may be disadvantageous in that Standard Digital Signal Processors (DSPs), which may be used to generate the noise, may be unable to generate noise samples in real time for wide bandwidth modems that communicate information using very high data link rates.

Alternatively, the noise may be simulated by generating an entire set of noise samples, and then storing the noise samples on a storage medium, for example, a hard disk. In this manner, the noise samples may, for example, be read from the storage medium and then provided to an external device, such as the ARB or D/A, to produce the analog noise waveform.

However, it is believed that this method disadvantageously requires large amounts of storage space for storing the noise samples. For example, 15 MHz band-limited noise, which must be sampled at a rate no less than the Nyquist rate of $30\times10^6$ samples per second, requires $30\times10^6$ memory locations in the storage medium. If each sample is represented by two Bytes to reduce quantization noise, $60\times10^6$ Bytes are required to generate one second of noise. However, since many test applications require upwards of 500 seconds or more of generated noise, $30\times10^7$ Bytes (i.e., 30 Gigabytes) of storage space would be required.

Furthermore, at least some test applications may require the generation of multiple noise waveforms, for example, 20 noise waveforms, each having a different statistical distribution and/or power spectral density. Thus, to store 500 seconds of 15 MHz band-limited noise samples for 20 different noise waveforms would require $600\times10^7$ Bytes (i.e., 600 Gigabytes) of storage space. Furthermore, for a given noise waveform type, multiple tests, each of which may require an uncorrelated set of noise samples from the noise waveform type, may be required. As a result, the overall storage requirements may become prohibitively expensive.

It is also believed that this simulation method disadvantageously requires that the noise waveform (i.e., the noise samples) be transferred to an active memory, for example, a Random Access Memory (RAM), before being provided to an external device, such as the ARB and/or D/A. However, this would require an additional RAM to store 30 Gigabytes of a single 500 second noise waveform.

SUMMARY OF THE INVENTION

An object of the present invention is to provide a noise simulation apparatus and method for simulating noise, in which noise waveforms of varying statistical distributions and/or power spectral densities may be generated for significant time durations, without suffering the disadvantages described above with respect to conventional noise simulation methods.

To achieve this object, a waveform generator for generating a desired waveform is provided, including a noise kernel configured to store a plurality of samples from a predetermined waveform, the plurality of samples being assigned to a plurality of memory blocks; and an address arrangement configured to randomly select a selected one of the plurality of memory blocks; wherein the noise kernel is configured to communicate the plurality of samples assigned to the selected memory block.

It is another object of the present invention to provide the waveform generator described above, in which the noise kernel includes at least one of a RAM, an EPROM, a flash memory, and an EEPROM.

It is still another object of the present invention to provide the waveform generator described above, in which each of the samples is represented by a predetermined number of Bytes.

It is yet another object of the present invention to provide the waveform generator described above, in which the predetermined number of Bytes includes 2 Bytes.

It is still another object of the present invention to provide the waveform generator described above, in which each of the memory blocks is assigned a number of the plurality of samples that is equal to a multiple of the coherence time of an autocorrelation function of the desired waveform.

It is yet another object of the present invention to provide the waveform generator described above, further including a sample generator configured to generate the samples stored in the noise kernel.

It is still another object of the present invention to provide the waveform generator described above, in which the sample generator is configured to generate the samples by executing a formula in accordance with a power spectral density of the desired waveform.

It is yet another object of the present invention to provide the waveform generator described above, in which the address arrangement is further configured to select a random number of consecutive memory blocks, and the noise kernel is configured to communicate the plurality of samples assigned to the consecutive memory blocks.

It is still another object of the present invention to provide the waveform generator described above, in which the random number of consecutive memory blocks are communicated by the noise kernel in reverse order.

It is yet another object of the present invention to provide a waveform generator, including a noise kernel configured to store a plurality of samples from a predetermined waveform; and an address arrangement configured to select a random number of consecutive samples of the plurality of samples; wherein the noise kernel is configured to communicate the consecutive samples of the plurality of samples.

It is still another object of the present invention to provide the waveform generator described above, in which consecutive samples of the plurality of samples are communicated by the noise kernel in reverse order.

It is yet another object of the present invention to provide the waveform generator described above, in which the noise kernel is configured to communicate the plurality of samples to an external device.

It is still another object of the present invention to provide the waveform generator described above, in which the external device includes one of an Arbitrary Waveform Generator and an analog to digital converter.

It is yet another object of the present invention to provide a method for generating a desired waveform of a predetermined time duration, including: a) generating a noise kernel; b) dividing the noise kernel into a plurality of memory blocks; c) selecting a random number of consecutive memory blocks; d) communicating the consecutive memory blocks; and e) re-executing steps c and d until the predetermined time duration has been reached.

It is still another object of the present invention to provide the method described above, in which the noise kernel includes samples representing a waveform shorter in time duration than that of the predetermined time duration.

It is yet another object of the present invention to provide the method described above, in which a duration of the noise kernel is selected, such that a power spectral density or an autocorrelation of the desired waveform approximate those of a required fidelity.

BRIEF DESCRIPTION OF THE DRAWINGS

FIG. 2 is a block diagram of a first exemplary noise kernel according to the present invention.

FIG. 5 is a block diagram of a second exemplary noise kernel according to the present invention.

DETAILED DESCRIPTION

Figure 1:
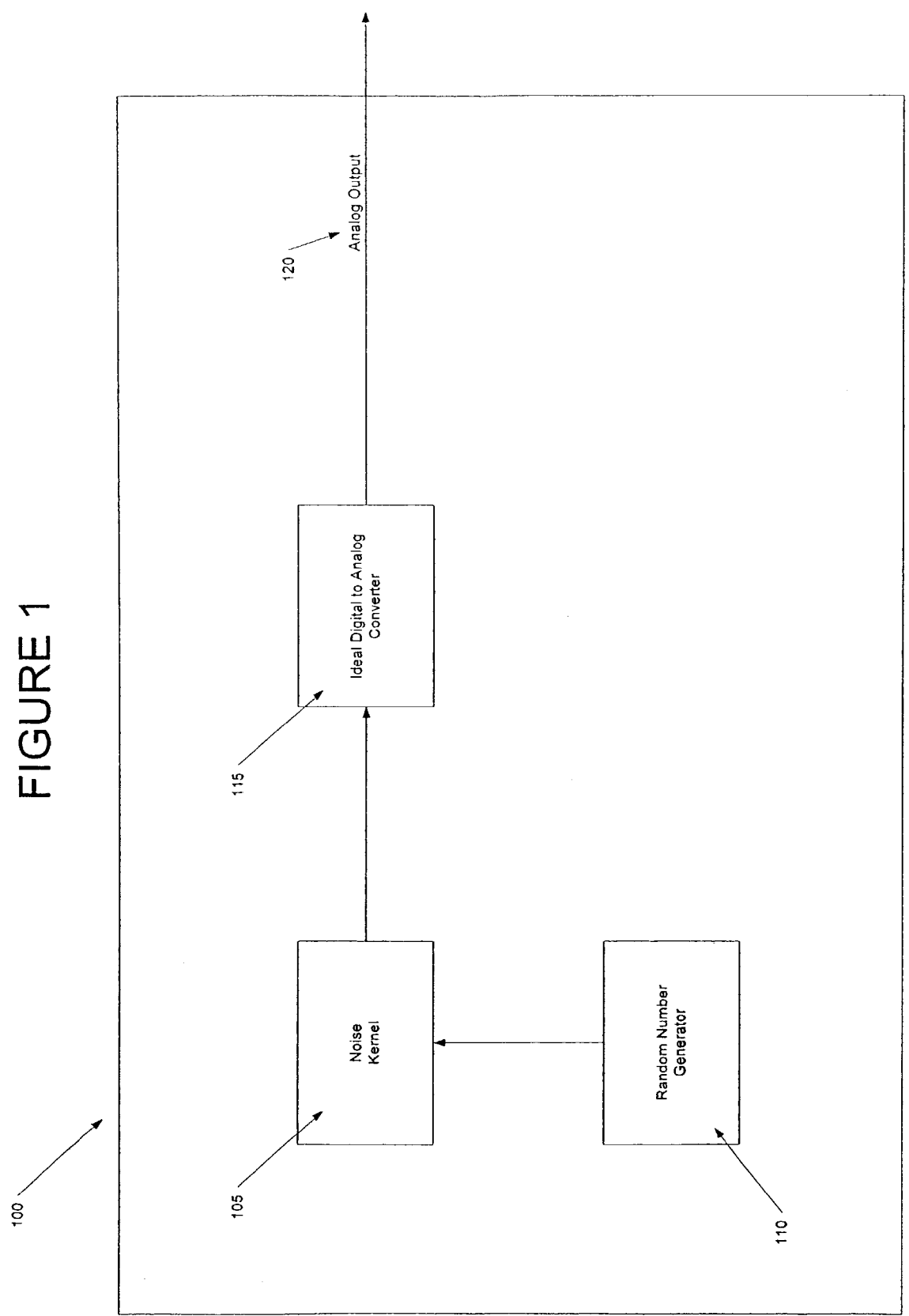
FIG. 1 is a block diagram of a first exemplary waveform generator according to the present invention.

Referring to FIG. 1, there is seen an exemplary waveform generator 100 according to the present invention, including a random number generator 110, a noise kernel 105 communicatively coupled to the random number generator 110, and an ideal digital to analog converter 115 communicatively coupled to the noise kernel 105, the ideal digital to analog converter 115 producing an analog output 120 of the waveform generator 100.

The analog output 120 may include any waveform, for example, a noise waveform, such as a Gaussian noise waveform. In this manner, the analog output 120 noise waveform may exhibit any statistical characteristic and/or statistical distribution and/or power spectral density, and may, for example, be used to simulate noise in a communication channel of, for example, a modem.

The noise kernel 105 includes a storage medium for containing various noise samples of the noise waveform, for example, a Gaussian noise waveform. The storage medium, for example, a random access memory (RAM), may include a plurality of memory locations (not shown) to store digital information representing a plurality of noise samples. The storage medium, for example, the RAM, may be addressed by the random number generator 110, which randomly selects memory locations, each of which contains a single noise sample. The noise kernel 105 then provides the addressed noise samples to the ideal digital analog converter 115 for producing the analog output 120.

The noise samples contained within the storage medium, for example, the RAM, may be obtained from a second storage medium (not shown), for example, a hard disk, before the waveform generator 100 produces a noise waveform for a bit error rate test. In this manner, the storage medium of the noise kernel 105 may loaded with one of various sets of noise samples stored on the second storage medium. These sets of noise samples may include different sets of, for example, Gaussian noise and/or sample sets of other noise waveforms having different statistical distributions and/or power spectral densities.

The random number generator 110 is operable to generate a random number for addressing the storage medium of the noise kernel 105. For this purpose, the random number generator 110 may randomly select addresses in accordance with a random variable having, for example, a uniform statistical distribution, and the randomly selected addresses may be provided to the noise kernel 105 at any desired sampling rate. For example, if the storage medium of the noise kernel 105 contained 1,048,576 (i.e., approximately one million memory locations), the random number generator may provide, for example, a random 20 bit parallel binary number to the noise kernel 105 for addressing the storage medium, for example, a RAM. The random number generator 110 may generate the random number using any of various conventional methods, for example, by implementing a pseudo-random number generator, a linear shift register, and/or a table of random numbers.

As the random number generator 110 randomly addresses the storage medium of the noise kernel 105, the noise kernel 105 provides the addressed digital noise samples to the ideal digital to analog converter 115. The digital to analog converter 115 is operable to convert the discrete digital noise samples into an analog equivalent (i.e., the analog output 120). In this manner, the ideal digital to analog converter 115 produces a continuous time waveform consisting of a series of delta functions (i.e., impulse functions) spaced in accordance with the sampling rate, each of the impulse functions having an area equal to a respective noise sample.

It should be noted that, although FIG. 1 shows an ideal digital to analog converter 115, which is not physically capable of being constructed, it should be appreciated that a conventional non-ideal digital to analog converter will not affect the operability of the present invention. Non-ideal digital to analog converters do not produce a series of impulse functions, but rather generate a continuous waveform by quantizing the discrete digital noise samples at the sampling rate. This quantizing introduces some distortion in the converted analog output 120. However, since the present invention is neither concerned with nor affected by the distortion effects of non-ideal digital to analog converters, ideal digital to analog converter 115 is provided to facilitate a better understanding of the present invention.

Referring now to FIG. 2, there is seen an exemplary noise kernel 105 according to the present invention. As shown in FIG. 2, noise kernel 105 includes a storage medium 205, which may include, for example, a RAM, a flash, and EPROM, an EEPROM, etc. The storage medium 205 includes a plurality of memory positions 210*a*, 210*b*, 210*c*, . . . , 201*n* for storing a plurality of noise samples, each of which is assigned to a single one of the memory positions 210*a*, 210*b*, 210*c*, . . . , 210*n*.

Each of the noise samples assigned to each of the memory positions 210*a*, 210*b*, 210*c*, . . . , 210*n* may be represented by a predetermined number of Bytes, for example, two bytes of digital information to reduce the effects of disadvantageous quantization noise. In this manner, the effects of the quantization noise decrease as the memory used to represent each noise sample increases. Thus, it should be appreciated that each of the memory positions 210*a*, 210*b*, 210*c*, . . . , 210*n*, may include any amount of memory for storing a respective noise sample.

As shown in FIG. 2, the random number generator 110 provides an address to the noise kernel 105 for selecting one of the memory positions 210*a*, 210*b*, 210*c*, . . . , 210*n*, the storage medium 205 providing the contents of the selected memory position (i.e., a single noise sample) to the ideal digital to analog converter 115.

Figure 3A:
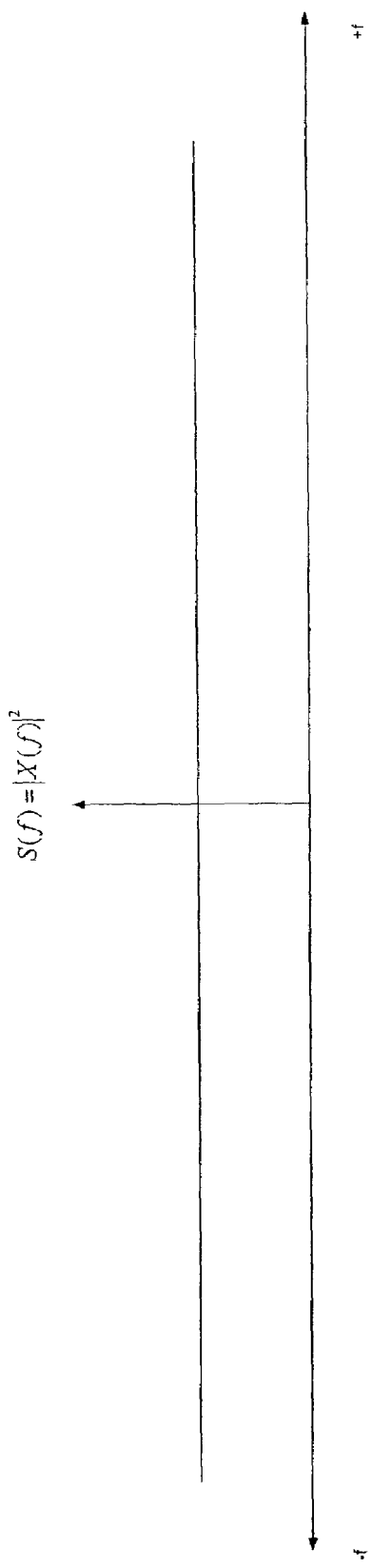
FIGS. 3a and 3b illustrate exemplary power spectral density and autocorrelation curves, respectively, for an analog noise waveform.
Figure 3B:
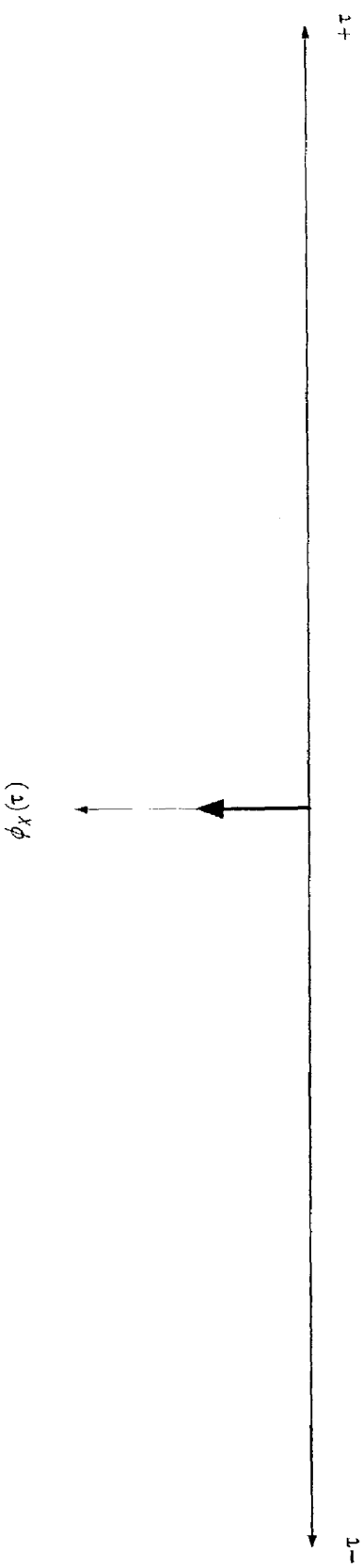

Referring now to FIGS. 3*a* and 3*b* there is seen the power spectral density and the autocorrelation function, respectively, of the analog output 120 shown in FIGS. 1 and 2. As shown in FIGS. 3*a* and 3*b*, the power spectral density of the analog output 120 (e.g., a Gaussian noise waveform) is a constant value in frequency and the autocorrelation function is an impulse function centered at zero.

It should be noted that the above method is described as producing, for example, a continuous Gaussian waveform, independent of the selected sampling rate, as a result of aliasing introduced by the ideal digital to analog conversion. However, since ideal digital to analog converters are not physically realizable, a pure non-band limited Gaussian waveform may not be produced in this manner.

Furthermore, the above method may be inadequate for producing band-limited noise, since each of the samples of the noise waveform are necessarily dependent upon one another. Thus, the random number generator may not randomly select noise samples from the noise kernel 105 to produce a band-limited noise waveform, even if the noise kernel 105 contained a sequential block of samples from a band-limited noise waveform.

Figure 4:
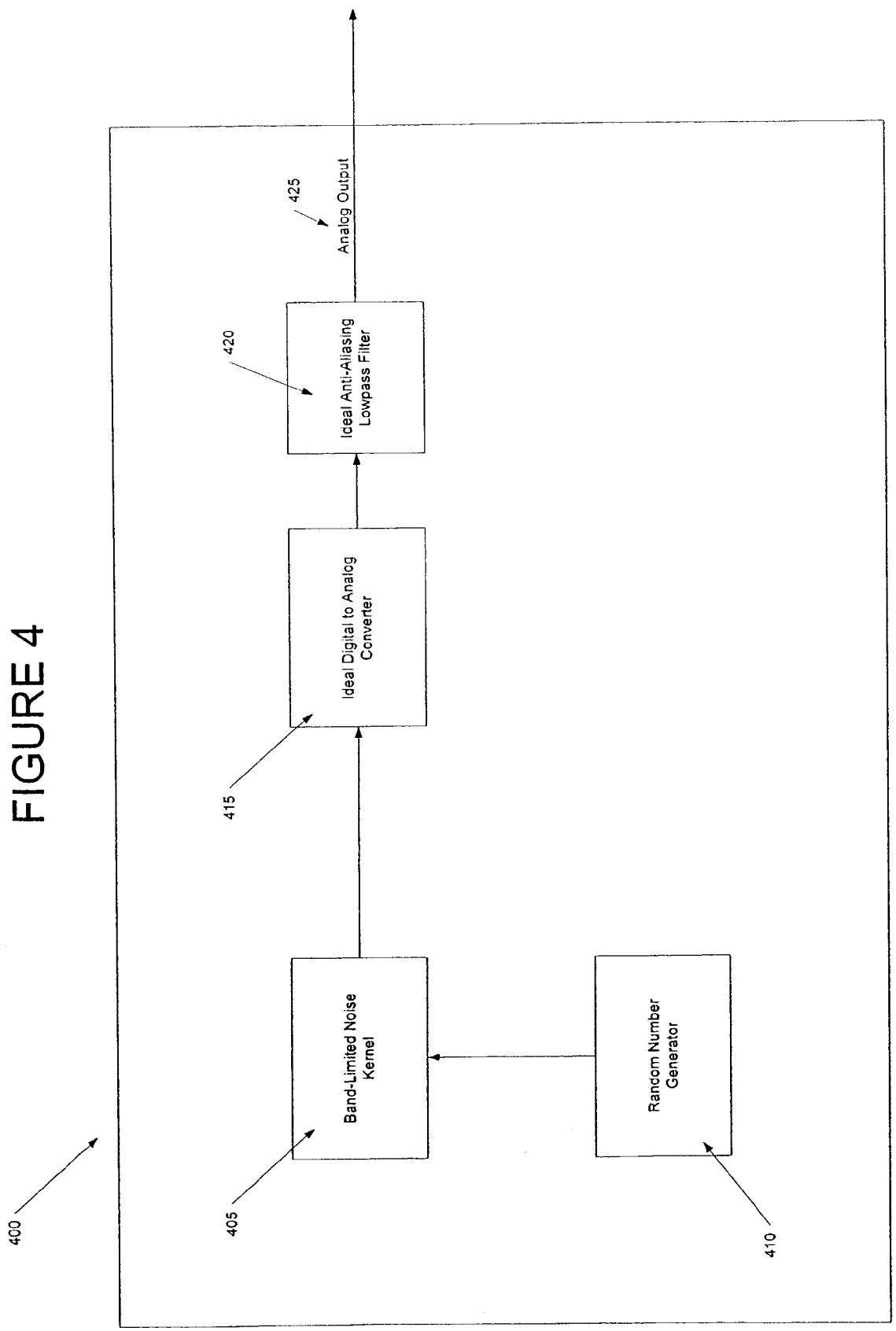
FIG. 4 is a block diagram of a second exemplary waveform generator according to the present invention.

Referring now to FIG. 4, there is seen an exemplary waveform generator 400 for producing a band-limited analog noise output 425. As shown in FIG. 4, the waveform generator 400 includes a random number generator 410, a band limited noise kernel 405 communicatively coupled to the random number generator 410, an ideal digital to analog converter 415 communicatively coupled to the band limited noise kernel 405, and an ideal anti-aliasing lowpass filter 420 communicatively coupled to the ideal digital to analog converter 415, the ideal anti-aliasing lowpass filter 420 producing a band limited analog noise output 425, which may be intentionally injected, for example, into a communication channel for testing a modem.

Referring now to FIG. 5, there is seen an exemplary band limited noise kernel 405 according to the present invention. As shown in FIG. 5, band limited noise kernel 405 includes a plurality of memory positions 510*xa*, 510*xb*, 510*xc*, . . . , 510*xn* divided among a plurality of memory blocks 505*a*, 505*b*, 505*c*, . . . , 505*n*, in which x identifies a particular memory block (i.e., a, b, c, . . . , n). The memory positions 510*xa*, 510*xb*, 510*xc*, . . . , 510*xn* are used to store consecutive noise samples of a band-limited noise waveform, for example, band-limited Gaussian noise. For example, 0.01 seconds worth of consecutive samples from a band-limited Gaussian waveform may be stored in the memory positions 510*xa*, 510*xb*, 510*xc*, . . . , 510*xn*.

In operation, the random number generator 410 provides an address to the band limited noise kernel 415 for selecting one of the memory blocks 505a, 505b, 505c, . . . , 505n. The band limited noise kernel 405 then provides the addressed memory block 505a, 505b, 505c, . . . , 505n to the ideal digital to analog converter 415 in a serial manner, one noise sample at a time. Thus, if the random number generator 410 selects, for example, the first memory block 505a, the band limited noise kernel 405 provides memory positions 510aa, 510ab, 510ac, . . . , 510an to the ideal digital to analog converter 415 one at a time beginning with memory position 510aa and progressing in order to memory position 510an.

It should be appreciated that, to generate noise limited by, for example, frequency (F) (i.e., having a one-side bandwidth of frequency F), the band limited noise samples stored in the memory positions 510xa, 510xb, 510xc, . . . , 510xn must be sampled no less than the Nyquist frequency of 2 F (i.e., no less than twice the one-side bandwidth of frequency F). Thus, for example, if the noise kernel 405 is to produce a band limited noise waveform limited by a frequency of 15 MHz, each of the memory positions 510xa, 510xb, 510xc, . . . , 510xn, must be sampled at a rate no less than 30 Mega-samples per second. Thus, for example, if the noise kernel 405 included a storage medium capable of storing two Megabytes, 0.033 seconds of a 15 MHz band-limited noise waveform may be sampled at the Nyquist frequency of 30 MHz and stored in the memory positions 510xa, 510xb, 510xc, . . . , 510xn of the storage medium, each of the samples being represented by two bytes.

However, it should be appreciated that the band limited noise samples may be sampled at a sampling rate above the Nyquist frequency, so that aliasing effects, which are produced when converting the noise waveform from the digital domain to the analog domain, may be more easily filtered by an anti-aliasing lowpass filter. In this manner, as the sampling rate of the band limited noise samples increases, the aliasing pattern becomes more spread out in frequency, thereby rendering it less difficult to filter the undesirable aliasing of the generated analog waveform, for example, a generated Gaussian noise waveform.

It should also be noted that the random number generator 410 may provide random addresses to the band-limited noise kernel 405 at a slower rate compared to the rate at which the band limited noise kernel 405 provides noise samples to the ideal digital to analog converter 415. Specifically, if each of the memory blocks 505a, 505b, 505c, . . . , 505n includes (n) memory locations, then the random number generator 410 may, for example, provide addresses to the band limited noise kernel 405 at a rate (n) times slower than a rate at which the band limited noise kernel 405 provides noise samples to the ideal digital to analog converter 415.

Referring back to FIG. 4, there is seen an ideal anti-aliasing lowpass filter 420 communicatively coupled to the ideal digital to analog converter 415. As described above, the anti-aliasing lowpass filter 420 operates to filter out the aliasing components caused by converting the noise samples from the digital domain to the analog domain. Although an ideal anti-aliasing lowpass filter 420 may not be physically constructed, those having ordinary skill in the art will recognize that the operability of the present invention is not affected by interference that may be generated by non-ideal anti-aliasing lowpass filters. The ideal anti-aliasing lowpass filter 420 is illustrated in the present invention merely to facilitate a better understanding of the present invention.

Figure 6A:
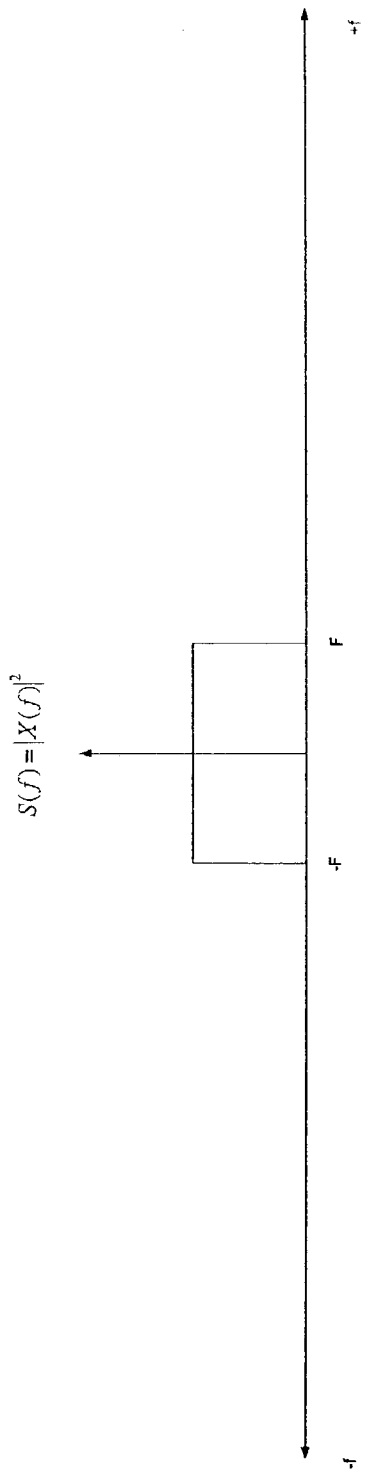
FIGS. 6a and 6b illustrate a power spectral density and an autocorrelation curve, respectively, for a band-limited analog noise waveform.
Figure 6B:
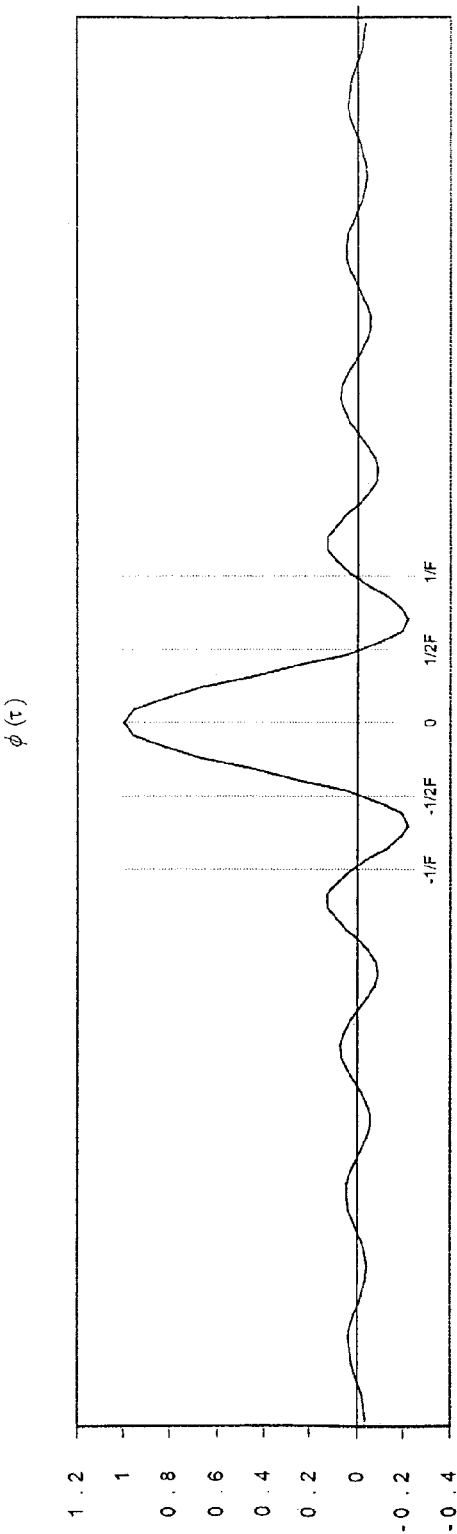
Figure 7A:
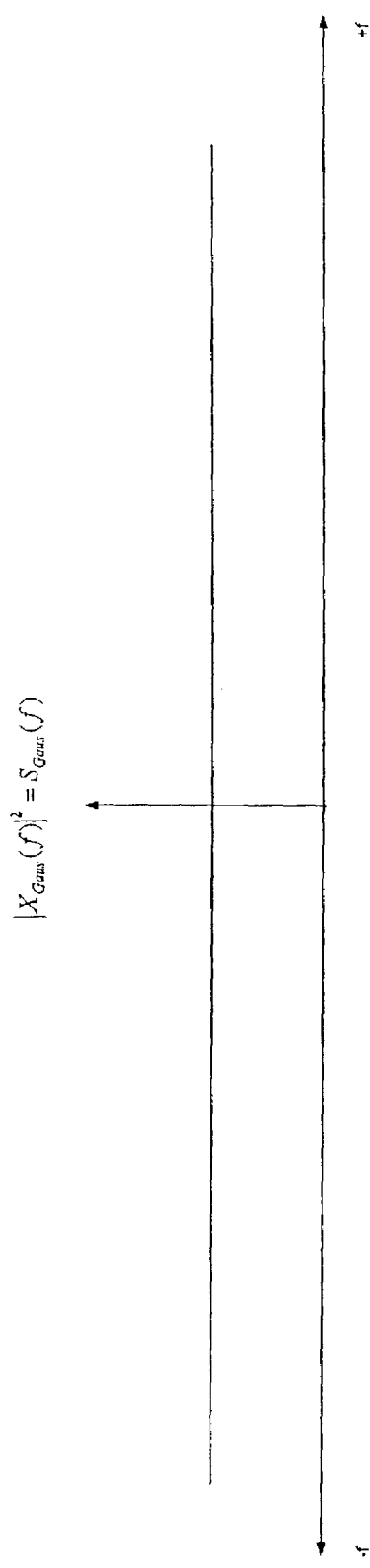
FIGS. 7a and 7b illustrate a power spectral density and an autocorrelation curve, respectively, for an exemplary additive white Gaussian noise waveform.
Figure 7B:
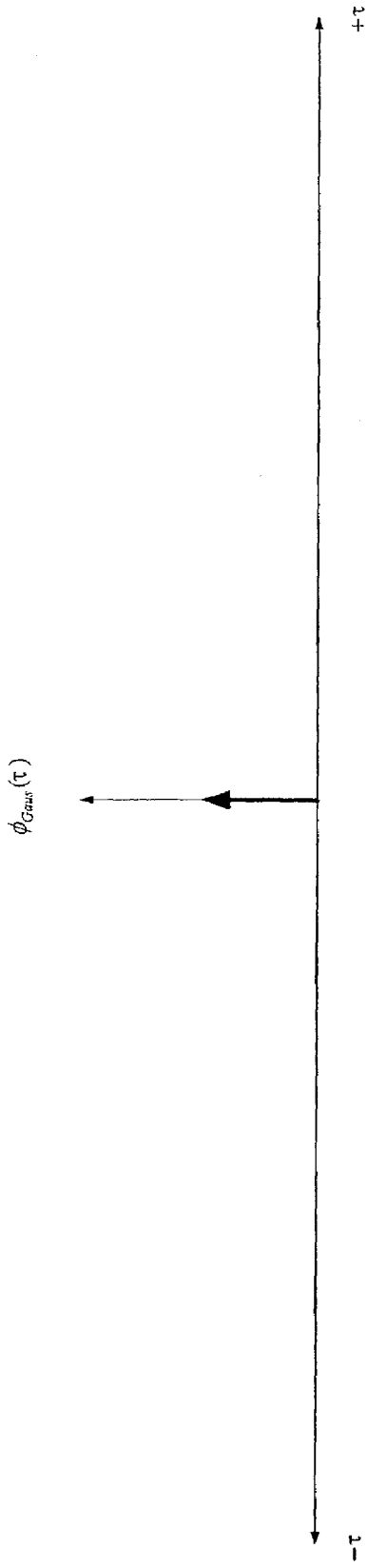
Figure 8A:
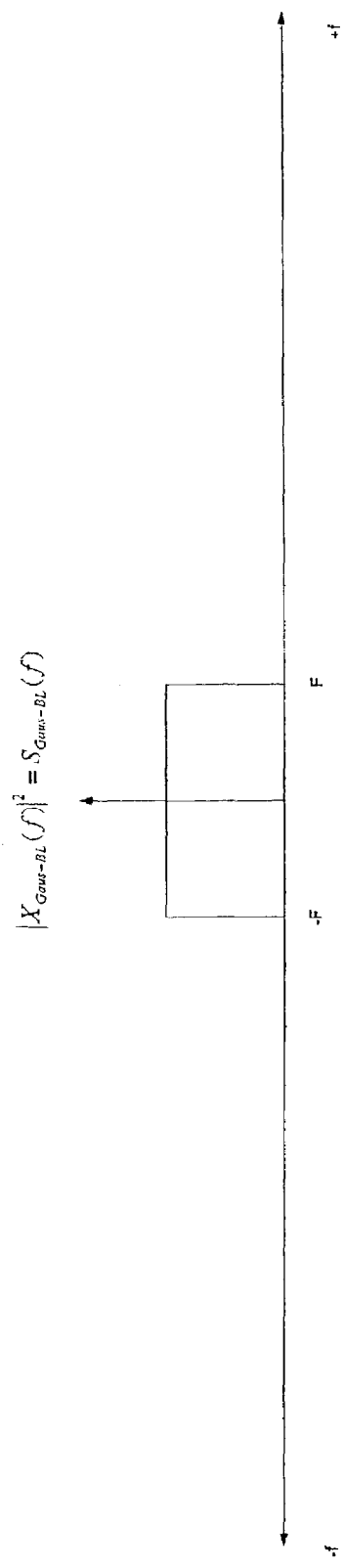
FIGS. 8a and 8b illustrate a power spectral density and an autocorrelation curve, respectively, for a band-limited Gaussian analog noise waveform.
Figure 8B:
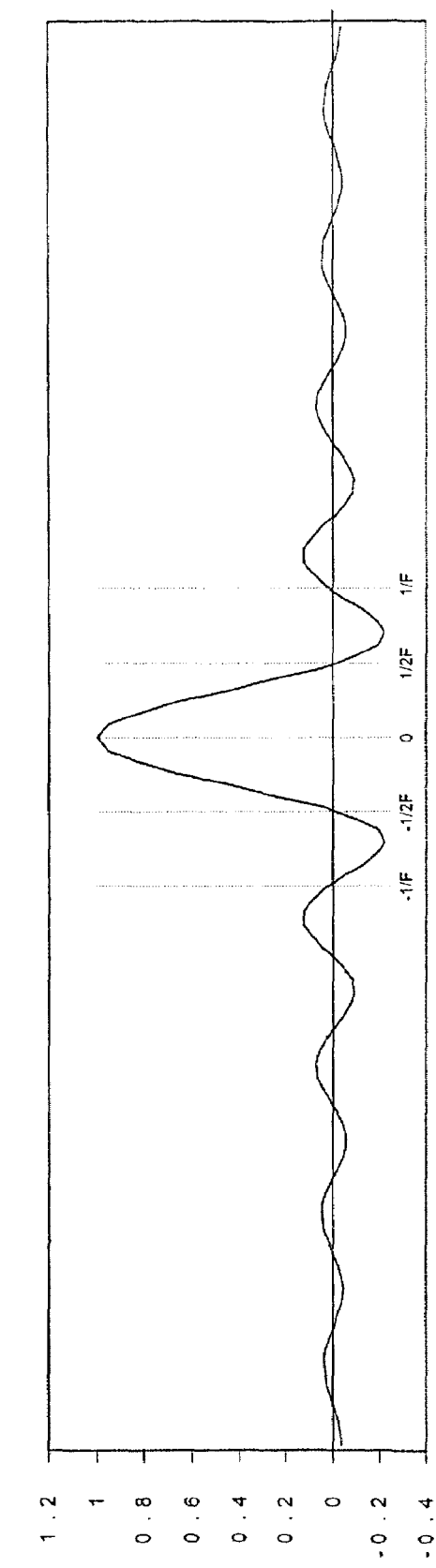

Referring now to FIGS. 6a and 6b, there is seen an exemplary power spectral density S(f) and auto correlation function $\phi(\tau)$, respectively, of the band limited analog output 425 of FIG. 4 for band-limited Gaussian noise. As seen in FIG. 6a, the power spectral density S(f) of the analog output 425 is a band-limited waveform having a one-sided bandwidth of frequency (F), and the auto correlation function $\phi(\tau)$ of the analog output 425 is a Sinc function with first negative and positive zero crossings at $-1/2$ F and $1/2$ F, respectively.

To help assure that the analog output 425 exhibits spectral characteristics similar to those of, for example, band-limited Gaussian noise, each of the memory blocks 505a, 505b, 505c, . . . , 505n should contain a sufficiently large number of memory positions for storing assigned noise samples. For example, it has been found that the spectral characteristics may be maintained if each of the memory blocks 505a, 505b, 505c, . . . , 505n stores a multiple of the "coherence time" of the auto correlation function, for example, 10 times the "coherence time," of the band-limited noise, in which the "coherence time" is the width of the main lobe of the autocorrelation function. With respect to the exemplary embodiment illustrated in FIG. 6, for example, the width of the main lobe is 1/F, i.e., the distance between the first negative and positive zero crossings (i.e., the distance between $-1/2$ F and $1/2$ F). Thus, for example, if the cutoff frequency (F) of the band limited analog output 425 is 1 MHz, the width of the main lobe of the autocorrelation function is 1/1 MHZ or 1 microsecond. Thus, each of memory blocks 505a, 505b, 505c, . . . , 505n may contain, for example, a multiple of 1 microsecond, for example, 10*1 microsecond (i.e., 10 microseconds) worth of band limited noise samples. In this manner, if each of the noise samples of each of the memory blocks 505a, 505b, 505c, . . . , 505n is sampled at a rate of, for example, 4 MHz (i.e., twice the Nyquist frequency of 2 MHz), each of the memory blocks 505a, 505b, 505c, . . . , 505n would include 40 memory positions. However, it should be appreciated that each of the memory blocks 505a, 505b, 505c, . . . , 505n may include any number of memory locations, so long as each of the memory blocks 505a, 505b, 505c, . . . , 505n is large enough to capture the spectral characteristics of the band-limited noise. For example, the storage medium of the band-limited noise kernel 405 may include 366 memory blocks 505a, 505b, 505c, . . . , 505n, each of which contains 1,024 memory positions for a total of 374,784 memory positions 510xa, 510xb, 510xc, . . . , 510xn.

It should also be appreciated that each of the memory blocks need not be a positive multiple of the coherence time, although electing the number of memory locations in this manner permits easier memory access.

Figure 9:
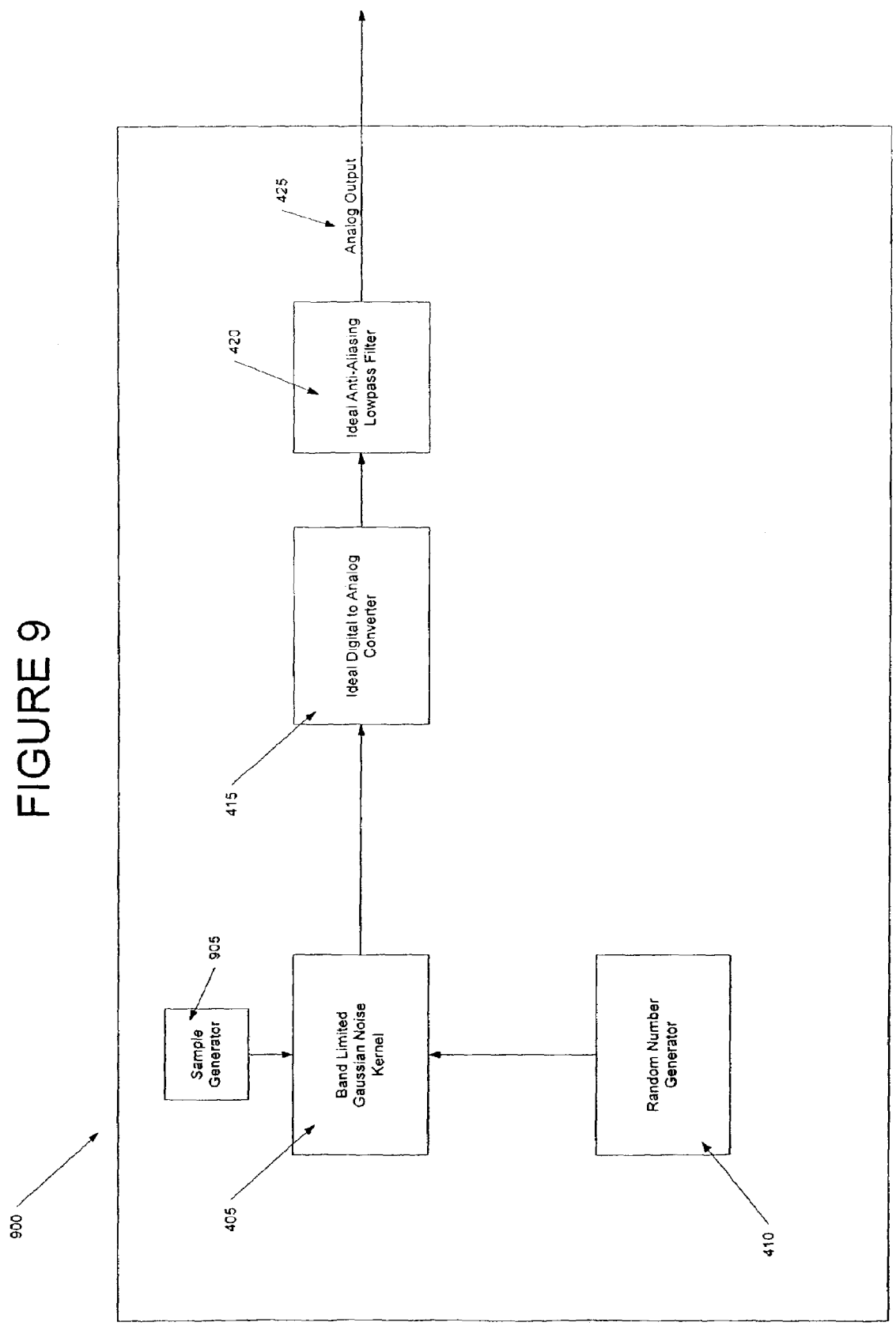
FIG. 9 is a block diagram of a third exemplary waveform generator according to the present invention.

Referring now to FIG. 9, there is seen another exemplary waveform generator 900 according to the present invention. Waveform generator 900 contains similar functional blocks as those illustrated with respect to FIG. 4, as well as an additional sample generator 905 operable to generate the noise samples stored in the band-limited noise kernel 405. In this manner, a user (not shown) may use the sample generator to generate noise samples having a particular statistical distribution and/or power spectral density and particular one-sided bandwidth. Once the values are generated by the sample generator 905, they may be stored in the memory positions 510xa, 510xb, 510xc, . . . , 510xn of the band-limited noise kernel 405 before the bit error rate test. In this manner, the sample generator 905 may produce noise waveform samples of various statistical characteristics and/or spectral characteristics for storage in the band-limited noise kernel 405, without requiring additional memory storage.

Alternatively, the sample generator 905 may execute a formula in accordance with the power spectral density of a desired band-limited noise waveform. In this manner, the samples stored in the noise kernel 405 may be computed from the formula and then stored in the storage medium of the noise kernel 405.

It should be appreciated that the method described above may not maintain the spectral characteristics of the band-limited noise waveform 425 across non-consecutive memory block boundaries. That is, by randomly selecting one of the memory blocks 505a, 505b, 505c, . . . , 505n at a time, out-of-band waveform discontinuities may appear at every block boundary (i.e., with a constant time period). In this manner, the periodic waveform discontinuities may produce disadvantageous harmonics in the power spectral density of the generated waveform.

Figure 10:
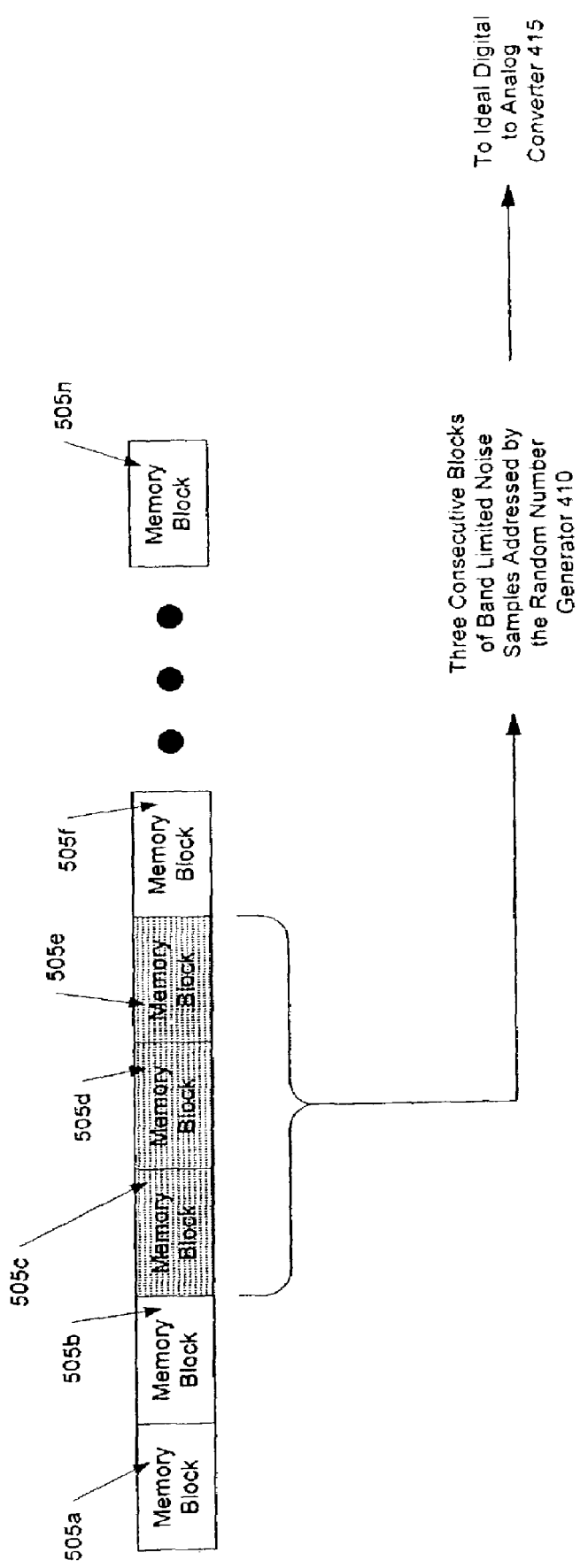
FIG. 10 is an exemplary consecutive memory block selection according to the present invention.

Thus, in accordance with another exemplary embodiment of the present invention, the random number generator 410 is further configured to generate an additional random number representing a number of consecutive memory blocks 505a, 505b, 505c, . . . , 505n to communicate to the ideal analog to digital converter 415. In this manner, the discontinuities at block boundaries do not occur periodically and, as such, the disadvantageous harmonics are not produced in the power spectral density of the generated waveform. Instead, since the discontinuities occur at random, their effects average out over time, thereby better maintaining the spectral characteristics of the intended band-limited noise waveform. Referring now to FIG. 10, there is seen an exemplary consecutive memory block 505a, 505b, 505c, . . . , 505n selection according to the present invention. In this exemplary embodiment, the random number generator 410 selects memory block 505c and an additional random number representing, for example, three consecutive memory blocks. In this manner, the band-limited noise kernel 405 communicates three consecutive memory blocks 505a, 505b, 505c, . . . , 505n to the ideal digital to analog converter 415, beginning with memory block 505c.

It should be appreciated that the operability of the present invention does not require that the random number generator 410 select addresses that begin on memory block boundaries. Rather, in accordance with another exemplary embodiment of the present invention, the random number generator selects a memory address of one of the memory positions 510xa, 510xb, 510xc, . . . , 510xn, as well as an additional random number representing a number of consecutive memory positions 510xa, 510xb, 510xc, . . . , 510xn to communicate to the ideal analog to digital converter 415.

It should also be appreciated that the operability of the present invention does not require that the noise kernel 405 communicate consecutive memory blocks 505a, 505b, 505c, . . . , 505n and/or memory positions 510xa, 510xb, 510xc, . . . , 510xn in ascending order. Rather, in accordance with another exemplary embodiment of the present invention, the random number generator 410 selects one of the memory blocks 505a, 505b, 505c, . . . , 505n, as well as an additional random number representing a number of consecutive memory blocks 505a, 505b, 505c, . . . , 505n to communicate to the ideal analog to digital converter 415 in reverse order.

Likewise, in accordance with another exemplary embodiment of the present invention, the random number generator 410 selects one of the memory positions 510xa, 510xb, 510xc, . . . , 510xn, as well as an additional random number representing a number of consecutive memory positions 510xa, 510xb, 510xc, . . . , 510xn to communicate to the ideal analog to digital converter 415 in reverse order.

Figure 12:
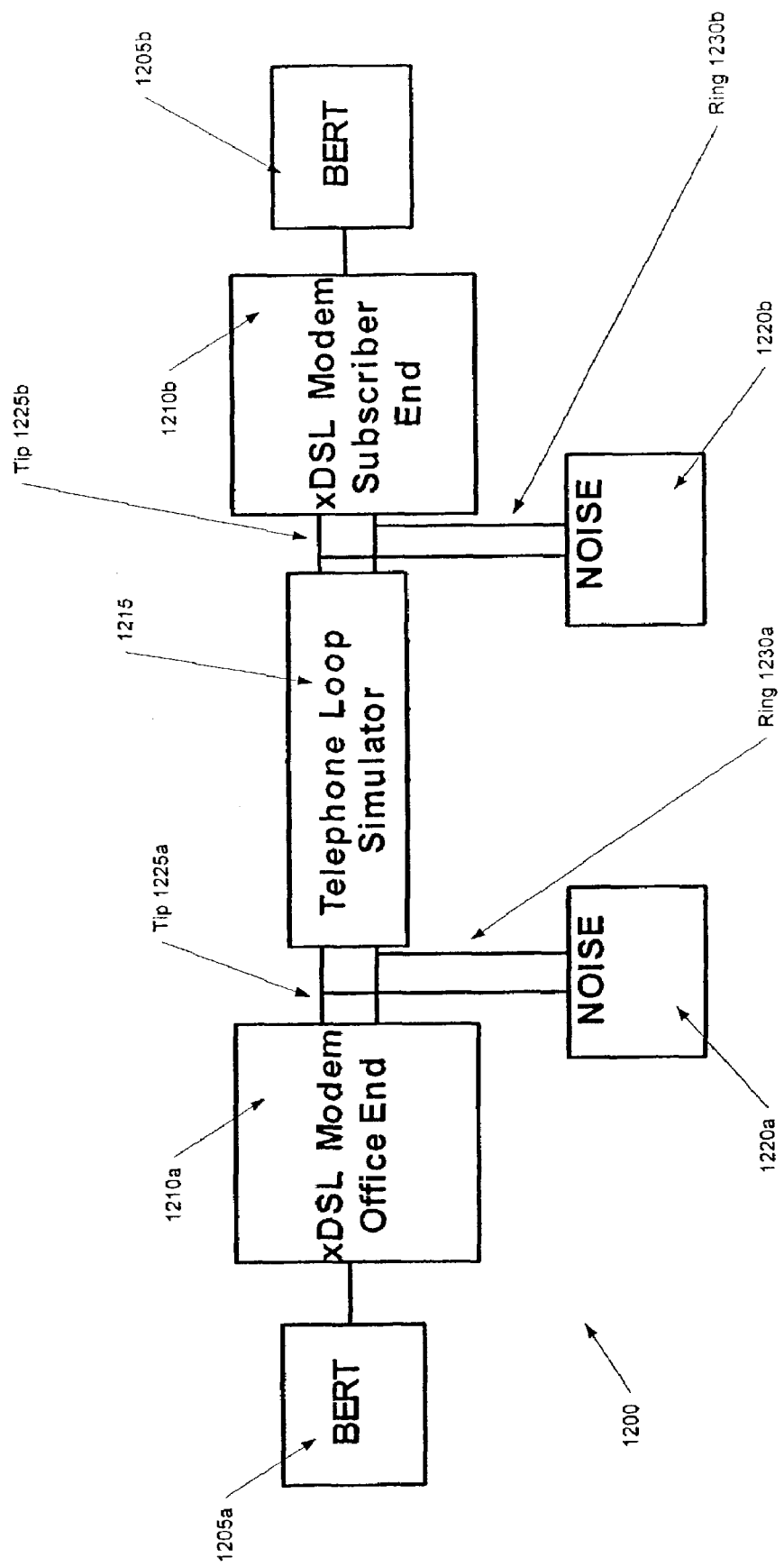
FIG. 12 is a block diagram showing an application for an exemplary waveform generator according to the present invention.

Referring now to FIG. 12, there is seen an exemplary application 1200 of the waveform generator 400, 900 according to the present invention. As shown in FIG. 12, the exemplary application 1200 includes xDSL modem office ends 1210a, 1210b communicatively coupled via a telephone loop simulator 1215. Noise waveform generators 1220a, 1220b inject noise into the communication channel via respective tips 1225a, 1225b and respective rings 1230a, 1230b, and two Bit Error Rate Measuring devices 1205a, 1205b measure the digital communication performance of the xDSL modem office ends 1210a, 1210b, respectively.

In order not to disturb signals generated by the xDSL modem office ends 1210a, 1210b, the Thévenin impedance of the noise waveform generators 1220a, 1220b should be high in comparison to the impedance of the telephone loop simulator 1215 and xDSL modem office ends 1210a, 1210b. If not, the low-impedance output of the noise waveform generators 1220a, 1220b may overdrive the communications channel, thereby disturbing the signals generated by the xDSL modem office ends 1210a, 1210b. Thus, the analog outputs of the noise waveform generators 1220a, 1220b, which may be low-impedance outputs, should be converted into high-impedance balanced current source outputs.

Figure 13:
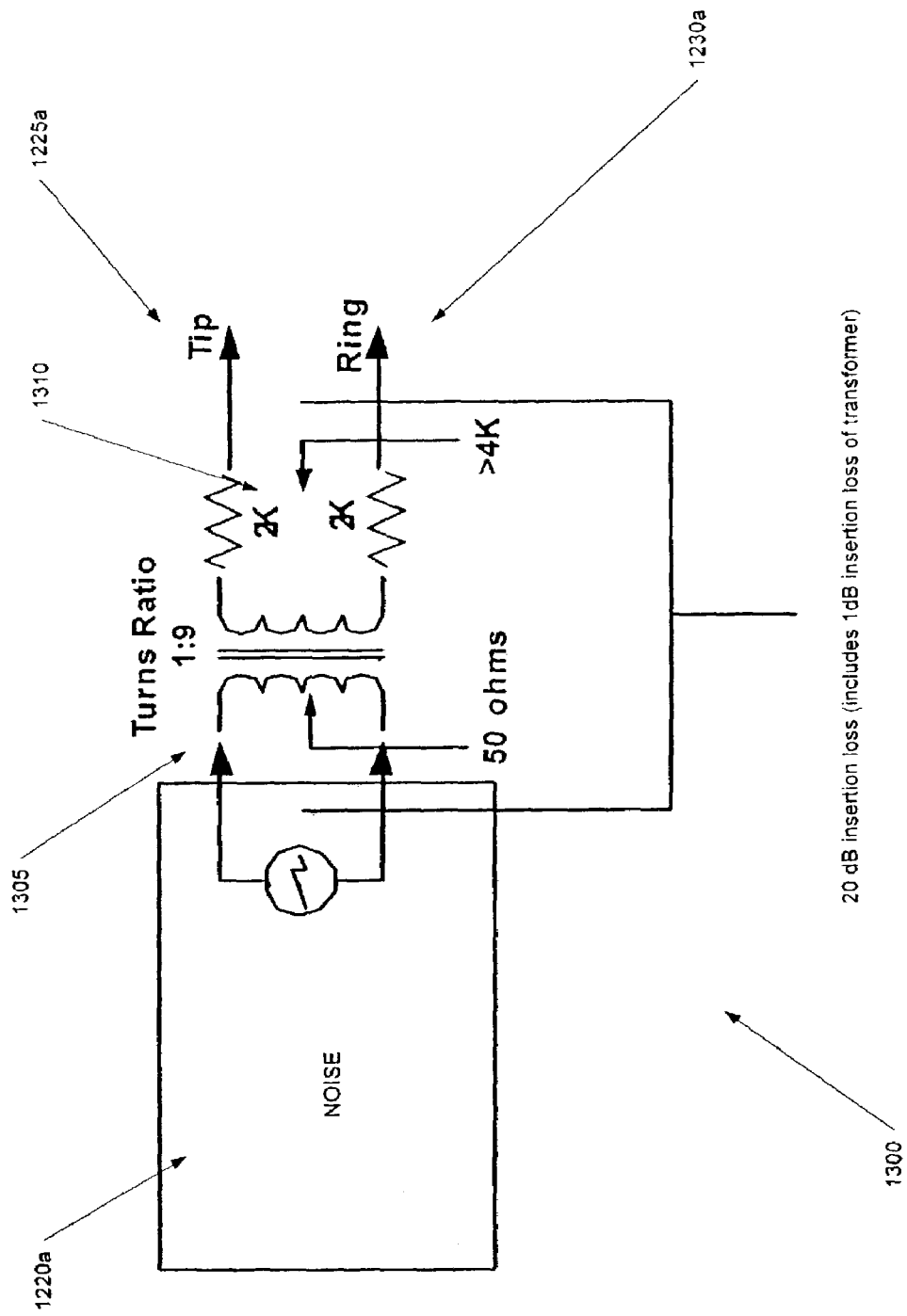
FIG. 13 is an exemplary conversion circuit according to the present invention for converting a low-impedance analog noise output into a high-impedance analog noise output.

Referring now to FIG. 13, there is seen an exemplary conversion circuit 1300 for converting the low-impedance outputs of the noise waveform generators 1220a, 1220b into high-impedance balanced current source outputs. As shown in FIG. 13, noise waveform generator 1220a generates a low-impedance analog noise output to transformer 1305, which may have a turn ratio of, for example, 1:9 (i.e., the voltage output of the transformer 1305 may be nine times that of the voltage input). The output of the transformer is then fed through a resistor network 1310, which may include two resistors, for example, two 2K Ohm resistors. The output of the resistor network 1310 is then fed into the communication channel via tip 1225a and ring 1230a.

In the exemplary embodiment illustrated in FIG. 13, the impedance of the resistor network is 4K Ohm as seen from the communications channel, i.e., two times the two 2K Ohm resistors. This impedance may, for example, be much larger than the impedance of the communications circuit itself (e.g., the impedance of the communications channel may be, for example, 50 Ohms). In this manner, the output of the resistor network injects the analog noise waveform as a high-impedance current source, with respect to the impedance of the communications channel.

It should be appreciated that, although FIG. 13 shows conversion circuit 1300 situated at the output of noise waveform generator 1220a, a similar conversion circuit may be situated at the output of the noise waveform generator 1220b.

Figure 11:
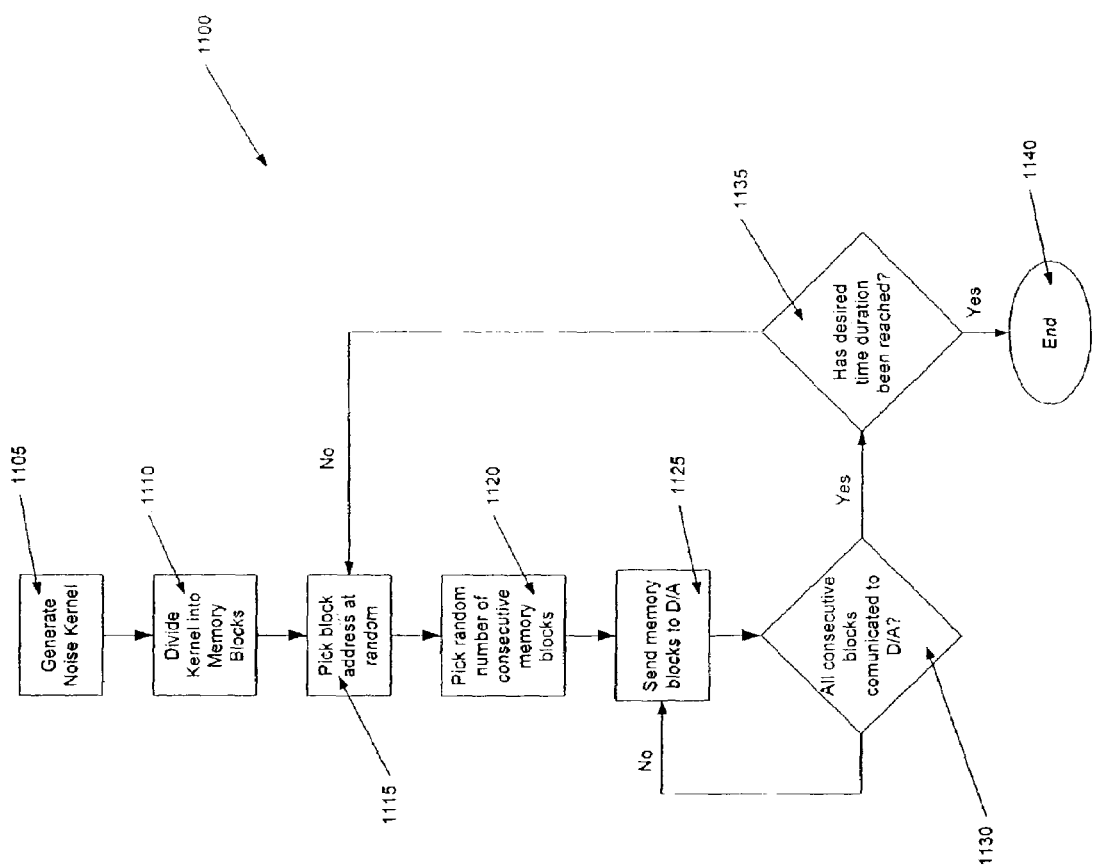
FIG. 11 is a block diagram showing an operational sequence for generating a band-limited noise waveform of a desired time duration according to the present invention.

Referring now to FIG. 11, there is seen an operational sequence 1100 for generating a band-limited noise waveform of a desired time duration. As shown in FIG. 11, the operational sequence 1100 begins at step 1105, in which the noise kernel of a desired band-limited noise waveform is generated. The kernel may include, for example, noise samples representing a waveform shorter in time duration (e.g., 0.01 seconds) than that of the desired time duration, for example, 100 seconds. The kernel should contain enough noise samples so that the spectral and correlation properties of the generated waveform accurately approximate a true noise waveform. However, the kernel should not contain too many noise samples, as this may require large amounts of expensive RAM. For example, a good heuristic is to set the duration of the kernel to a large enough multiple of the width of the main lobe of the autocorrelation function, for example, 500 samples. However, to realize a large enough number of memory blocks 505a, 505b, 505c, . . . , 505n, the kernel may contain, for example, approximately 100,000 samples. This number of samples may be large enough to approximate the power spectral density and autocorrelation of the desired waveform, while simultaneously keeping the RAM requirements low.

The duration of the kernel may also be selected, such that the power spectral density and autocorrelation of the kernel approximate those of a required fidelity, for example, +/−2% error or +/−0.05 dB.

Next, the operational sequence 1100 executes step 1110, in which the noise kernel is divided into a number of memory blocks 505a, 505b, 505c, . . . , 505n. The kernel should be divided into as many memory blocks 505a, 505b, 505c, . . . , 505n as possible, while maintaining the spectral and correlation properties of the desired noise waveform. For example, a block length may include 1024 noise samples. This number of samples may be enough to capture the power spectral density or autocorrelation properties of the desired noise waveform and, since the number of samples (i.e., 1024) is a power of 2, blocks may be more easily divided in conventional computer memory or software. Thus, if the noise kernel includes 0.01 seconds worth of noise samples, e.g., 375,000 samples, the kernel may be divided into 366 blocks, each of which may be separately addressed by the random number generator 410.

Next, the operational sequence 1100 executes steps 1115 and 1120, in which the random number generator 410 randomly selects one of the memory blocks 505a, 505b, 505c, . . . , 505n, as well as a random number representing a number of consecutive memory blocks 505a, 505b, 505c, . . . , 505n to communicate to the ideal analog to digital converter 415.

Then, step 1125 is executed, in which the consecutive memory blocks 505a, 505b, 505c, . . . , 505n are communicated to the ideal digital to analog converter 415. The contents of the consecutive memory blocks 505a, 505b, 505c, . . . , 505n are communicated serially, until query block 1130 determines that all memory positions 510xa, 510xb, 510xc, . . . , 510xn of the consecutive memory blocks 505a, 505b, 505c, . . . , 505n have been communicated to the ideal digital to analog converter 415.

Once the consecutive memory blocks 505a, 505b, 505c, . . . , 505n have been communicated to the ideal digital to analog converter 415, step 1135 is executed, in which it is determined whether the generated noise waveform has reached the predetermined time duration, for example, 100 seconds. If not, step 1115 is re-executed, in which the random number generator 410 randomly selects one of the memory blocks 505a, 505b, 505c, . . . , 505n, as well as a random number representing a number of consecutive memory blocks 505a, 505b, 505c, . . . , 505n to communicate to the ideal analog to digital converter 415. If so, the operational sequence 1100 terminates at end block 1140.

What is claimed is:

1. A waveform generator for generating a desired waveform, comprising:

a noise kernel configured to store a plurality of samples from a predetermined waveform, the plurality of samples being assigned to a plurality of memory blocks; and an address arrangement configured to randomly select a selected one of the plurality of memory blocks, wherein each of the memory blocks is assigned a number of the plurality of samples that is equal to a multiple of the coherence time of an autocorrelation function of the desired waveform;

wherein the noise kernel is configured to communicate the plurality of samples assigned to the selected memory block.

2. The waveform generator according to claim 1, wherein the noise kernel includes at least one of a RAM, an EPROM, a flash memory, and an EEPROM.

3. The waveform generator according to claim 1, wherein each of samples is represented by a predetermined number of Bytes.

4. The waveform generator according to claim 1, wherein the predetermined number of Bytes includes 2 Bytes.

5. The waveform generator according to claim 1, further comprising:

a sample generator configured to generate the samples stored in the noise kernel.

6. The waveform generator according to claim 5, wherein the sample generator is configured to generate the samples by executing a formula in accordance with a power spectral density of the desired waveform.

7. The waveform generator according to claim 1, wherein the address arrangement is further configured to select a random number of consecutive memory blocks, and the noise kernel is configured to communicate the plurality of samples assigned to the consecutive memory blocks.

8. The waveform generator according to claim 1, wherein the random number of consecutive memory blocks are communicated by the noise kernel in reverse order.

9. The waveform generator according to claim 1, wherein the noise kernel is configured to communicate the plurality of samples to an external device, the external device producing a first analog output.

10. The waveform generator according to claim 9, wherein the external device includes one of an Arbitrary Waveform Generator and an analog to digital converter.

11. The waveform generator according to claim 9, further comprising:

a conversion circuit to convert the first analog output into a high-impedance balanced output.

12. The waveform generator according to claim 11, wherein the conversion circuit includes a transformer electrically coupled to the external device and a resistor network electrically coupled to the transformer.

* * * * *